United States Patent [19]
Walker et al.

[11] Patent Number: 5,299,939
[45] Date of Patent: Apr. 5, 1994

[54] SPRING ARRAY CONNECTOR

[75] Inventors: George F. Walker, New York; Arthur Zingher, White Plains, both of N.Y.

[73] Assignee: International Business Machines Corporation, Armonk, N.Y.

[21] Appl. No.: 847,970

[22] Filed: Mar. 5, 1992

[51] Int. Cl.⁵ .............................................. H01R 9/09
[52] U.S. Cl. ........................................ 439/74; 439/66; 439/284
[58] Field of Search ..................... 439/55, 65, 66, 74, 439/75, 284–295, 67, 77

[56] References Cited

U.S. PATENT DOCUMENTS

| | | | |
|---|---|---|---|
| 3,795,037 | 3/1974 | Luttmer | 29/628 |
| 3,851,297 | 11/1974 | Munro | 339/61 M |
| 3,951,493 | 4/1976 | Kozel et al. | 439/591 |
| 3,960,424 | 6/1976 | Weisenburger | 339/17 M |
| 4,184,729 | 1/1980 | Parks et al. | 339/17 F |
| 4,245,876 | 1/1981 | Ritchie et al. | 339/59 M |
| 4,477,134 | 10/1984 | Wright | 439/77 |
| 4,548,451 | 10/1985 | Benarr et al. | 439/66 |
| 4,655,519 | 4/1987 | Evans et al. | 339/17 CF |
| 4,734,045 | 3/1988 | Hawkins | 439/676 |
| 5,183,409 | 2/1993 | Clever et al. | 439/291 |

OTHER PUBLICATIONS

IBM Technical Disclosure, Dunman, vol. 7, No. 3, p. 182, Aug. 1964.
IBM Technical Disclosure, vol. 31, No. 2, p. 101, Jul. 1988.

*Primary Examiner*—Neil Abrams
*Attorney, Agent, or Firm*—Perman & Green

[57] ABSTRACT

A spring array connector includes a unitary resilient layer of multiple springs having a layer of multiple electrically conducting lines, electrical contacts and electrical terminals. Each spring of the array is independently bendable and each of the conducting lines is electrically isolated from the other conducting lines. All of the springs in the spring array are fabricated simultaneously. Spring embodiments include sine, helix, cantilever and buckling beam shapes in sheet and wire forms.

18 Claims, 13 Drawing Sheets

SPRING ARRAY CONNECTOR

BACKGROUND OF THE INVENTION

The present invention relates to a spring array connector and specifically to a spring array connector which is mechanically unified but electrically segmented for interconnecting components and circuit boards in electrical apparatus.

Tape Automated Bonding or TAB is often used for surface mounted electrical components. Many electrical components are mounted on a tape roll with frames, similar to 35 mm movie film. At each frame on the roll, there is printed circuit wiring with a component attached. The wiring is used to bond the component to a printed circuit board.

The Harkon Pin Array is used in IBM mainframe computers to connect large electronic modules with a printed circuit board. This connector system uses an array of discrete pins, an array of discrete sockets, and a cam plate. The pins insert loosely into the sockets with almost zero force per pin. Then the cam plate forces the array sideways, which caused wiping and engagement of the electrical connections.

A Harkon Pin Array may have several thousand pins. Nevertheless, the total insertion force is moderate because the effect of having a large number of pins is cancelled by the near zero force per pin.

A Zebra Connector is used in some electronic watches. The connector includes an elastomeric sheet with densely spaced parallel wires penetrating the sheet. Each wire is electronically independent and separately bendable. The sheet is interposed between two arrays of electronic terminals.

Micro-coaxial cables are used to transmit high bandwidth electrical signals with little attenuation, reflection, and echoes. One example is a metal wire, with concentric dielectric coating, and concentric outer metal coating. This provides a well-controlled uniform AC impedance.

The Coil Chain Zipper is a well-known technology to mechanically connect two edges of cloth. Attached to each edge is a coil of metal or strong plastic. A sliding actuator engages these coils and interleaves the turns of the two coils. By sliding in the reverse direction, the actuator separates the turns of the two coils, and disengages the two edges.

The Canted Coil Spring is sold by Bal Seal Engineering Co., Santa Ana, Calif. This spring is a wire coil, shaped like a helix, but skewed parallel to its axis. When squeezed in a direction perpendicular to its axis, the spring bends with approximately constant force versus deflection. One application is a spring reinforced seal ring for low friction moving seals. Therefore, a skewed torroidal helix of wound wire is embedded inside an elastomeric seal ring.

The "banana plug" has long been used to connect a wire to a socket. The plug includes a springy metal sheet, shaped like a cross with four narrow legs. The sheet is bent over an end of a central rod so that the four legs bulge along the sides of the rod. At the base of the rod the legs are attached to a wire. When the plug is inserted into a socket, the springy legs bend to fit the socket.

Filed on the same date as this patent application is a patent application entitled "A Printed-Circuit-Like Array of Springs with Non-Linear Force vs Deflection", having an inventor in common with an inventor of this application, that teaches a class of sheet metal springs which buckle during bending which application is incorporated herein by reference. One example is a spring shaped in the form of Greek letter Ω Omega. When vertically squeezed, the force is roughly independent of deflection over a significant range. An array of many springs can be fabricated in parallel from a sheet of springy metal and a baseplate. The springy sheet is etched (like a printed circuit), then gang-folded (die-formed), and then attached to the baseplate. That same patent application describes a "pleay" shape spring which is closely related to an Omega spring.

U.S. Pat. No. 3,795,037 describes an electrical connector with a plurality of elongated flexible connectors, such as bowed wires, embedded in and extending between the surfaces of a block of elastomeric insulating material.

U.S. Pat. No. 3,851,297 describes a substrate connector with a tubular spring body and wire connectors helix-wound around this tube. There is a longitudinal slot in the tubular spring body and the wound wires.

U.S. Pat. No. 3,960,424 describes a multi-contact spring interposer for board to board connections. The interpose has multiple contact elements, each with spring arms. There is a dielectric rigid support which applies a high contact pressure in spite of a wide deflection range.

U.S. Pat. No. 4,184,729 describes a flexible connector cable. There is a flat flexible printed circuit cable with raised soft metal bumps. The cable is interposed between a pair of flat circuit boards with matching connector areas.

The soft metal bumps are deformed under pressure to provide good electrical contact.

U.S. Pat. No. 4,245,876 describes a laminated connector for connections along the edge of a printed circuit board. A continuous row of spring conductor strips are located on an insulating web.

U.S. Pat. No. 4,655,519 describes an electrical interposer to connect arrays of conductive areas. The interposer has a dielectric housing with compartments having connector elements with cantilever spring arms.

The present invention is distinct from and provides an improvement over the above described connectors.

SUMMARY OF THE INVENTION

In accordance with the teachings of the present invention, an electrical array connector is described which has the following desirable properties: a very high density and quantity of electrical contacts and the fabrication effort and cost is moderate and is substantially independent of the quantity of contacts comprising the connector. Moreover, the connector provides substantial compliance in order to provide compensation for variations, including manufacturing tolerances, alignment tolerances and thermo-mechanical expansion. Engagement and disengagement is with low stress compared to the quantity of contacts. The electrical connection has low contact resistance and low AC impedance (e.g. unbalanced inductance).

The novel concepts embodied in the array spring connector is best understood by comparison of the connector with the Harkon Array Connector described above. The Harkon Array Connector includes an array of male pins and an array of female pins. Each pin is discretely manufactured and individually placed in an array. Each pin is both a mechanical spring for compliance and an electrical conductor.

The present invention provides several advantages and improvement over known connectors. In accordance with the teachings of the present invention an array of springs is integrated into a single component layer. The layer has a structure and is fabricated in a manner similar to that of a printed circuit board or an integrated circuit. That is, the springs are "micromechanical" in terms of structure and fabrication.

In a preferred embodiment of the invention, the springs are three dimensional. By contrast, prior micromechanical structures typically comprised several two-dimensional layers with a very restricted three-dimensional structure.

Moreover, in the present invention the springs bend as a result of buckling in accordance with a non-linear force versus deflection relationship. In prior connectors and micro-mechanical structures, cantilever bending is used which has a linear force versus deflection relationship.

Also, the electrical conductors in the present invention are not identical with mechanical springs. Instead, the electrical conductors are distinct and are considerably more numerous than the corresponding springs, thus permitting greater density of electrical connections. However, the electrical conductors have a structure and a fabrication in a manner similar to that of a three-dimensional printed circuit or integrated circuit.

An object of the present invention is therefore the provision of an array spring connector containing a high density of connectors with three dimensional compliance.

Another object of the invention is the provision of an array spring connector having a low resistance and low inductance connection.

A principal object of the invention is the provision of an array spring connector including a unitary spring member.

Another principal object of the invention is the provision of an array spring connector including a unitary spring member and a plurality of electrical contacts connected to the spring member at electrically isolated locations.

A further object of the invention is the provision of a simplified and low cost array spring connector and fabrication method thereof.

A still further object of the invention is the provision of a process for fabricating an array spring connector using processes similar in principle to those used in printed circuit and integrated circuit fabrication.

Further and still other objects of the present invention will become more clearly apparent when the following description is read in conjunction with the accompanying drawings.

DETAILED DESCRIPTION

Figure 1:
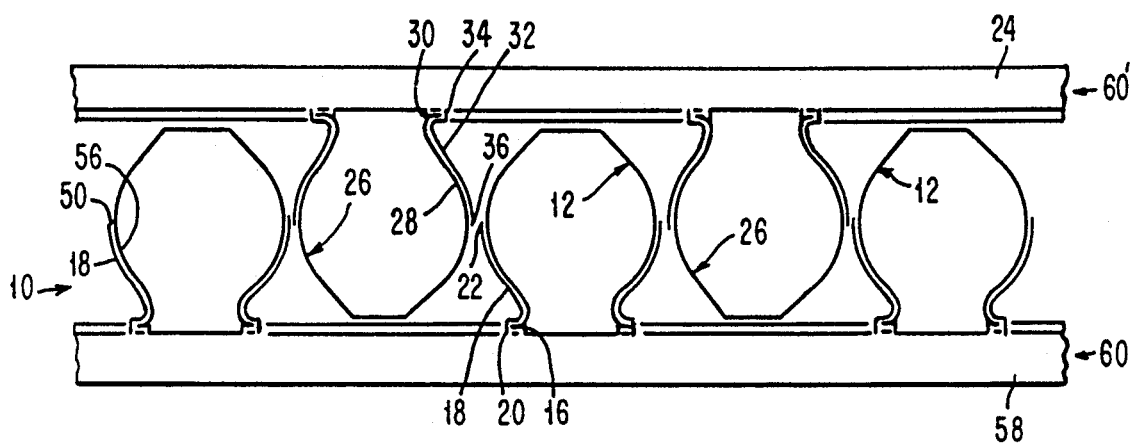
FIG. 1 is a cross-sectional view of a preferred embodiment of a mating pair of an array spring connector with associated electrical conductors.

Referring now to the figures and to FIG. 1 in particular, there is shown a cross-sectional representation of a preferred embodiment of the present invention. A first array spring connector 10 comprises a plurality of springs 12. Each spring 12 is covered with an overall electrical layer 14. A conductor 18 is connected at one end to a terminal 20, and at the other end to an electrical contact 22. Each spring 12 forming the array is independently bendable and each conductor 18 is electrically isolated from each other conductor in the spring array.

As shown in FIG. 1, a second array spring connector having a complementary plurality of springs 26 covered with an overall electrical layer 28 is mated with connector 10. A conductor 32 is connected at one end to a terminal 34 and its other end to an electrical contact 26.

Figure 2:
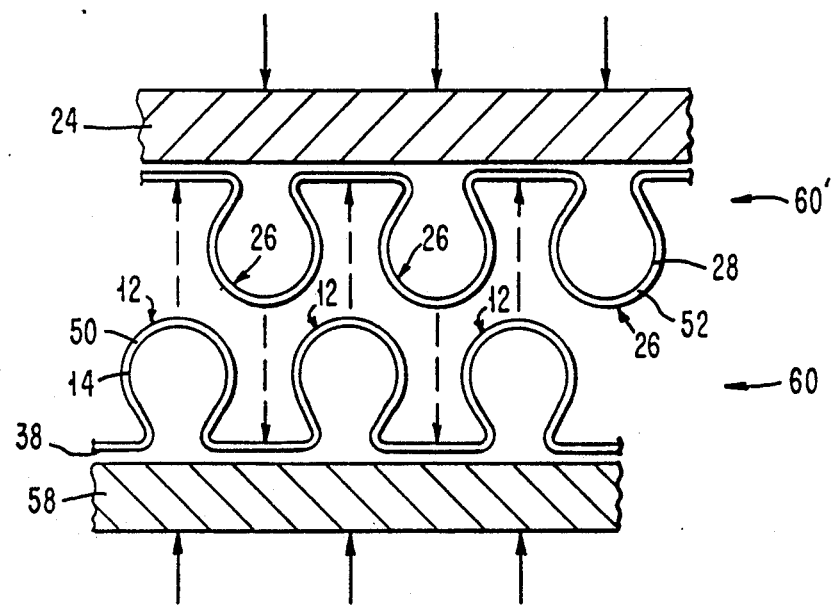
FIG. 2 is a cross-sectional view illustrating mating of a pair of array spring connectors.
Figure 5:
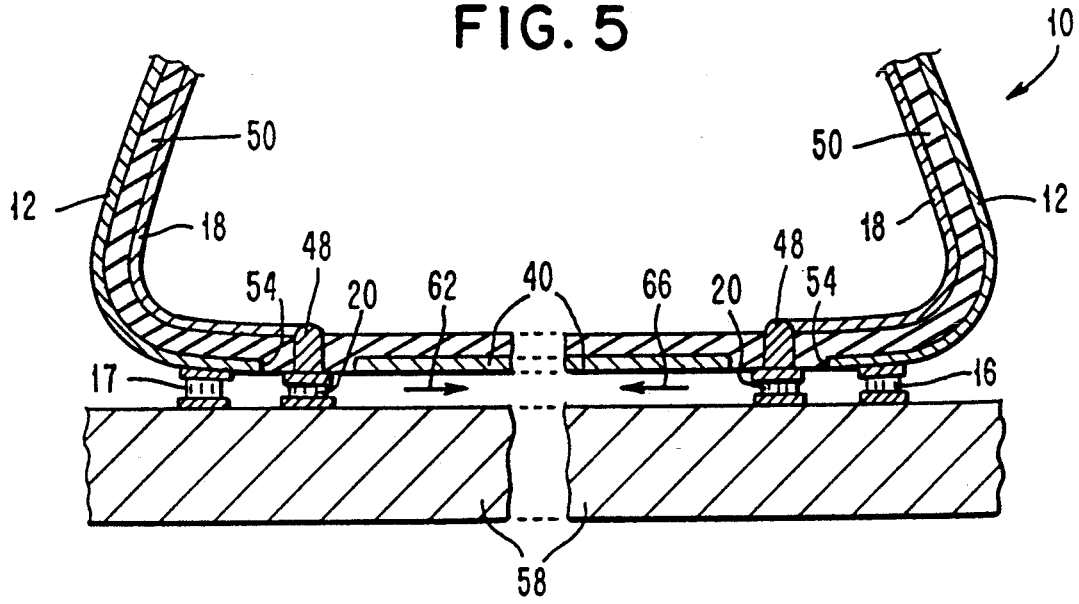
FIG. 5 is a cross-sectional view illustrating the attachment of a spring to a baseplate.
Figure 6:
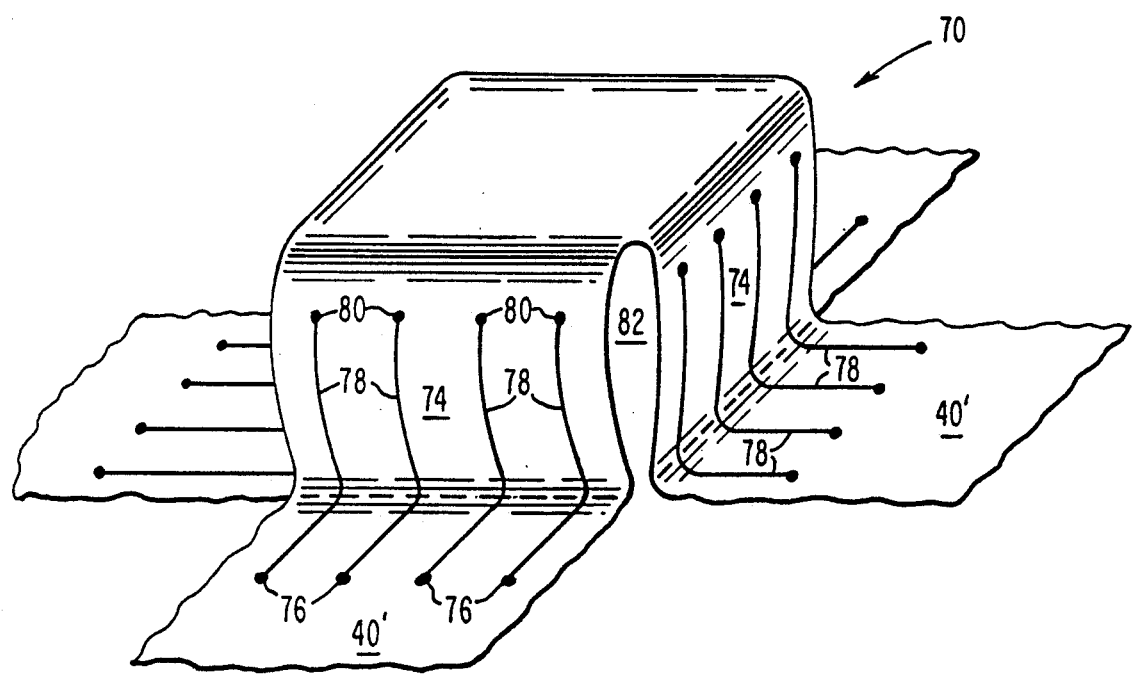
FIG. 6 is an isometric view of a "quad-Omega" spring.

As shown in FIGS. 2 and 5, where the connectors are shown disengaged, the spring array is a continuous, unitary sheet layer of resilient material 38. Each spring 12 in the array is independently bendable and mechanically isolated from adjoining springs by virtue of the spring support 16 and isolation regions 40. Similar isolation regions 40' and 40" are shown in FIGS. 6 and 7.

Figure 3:
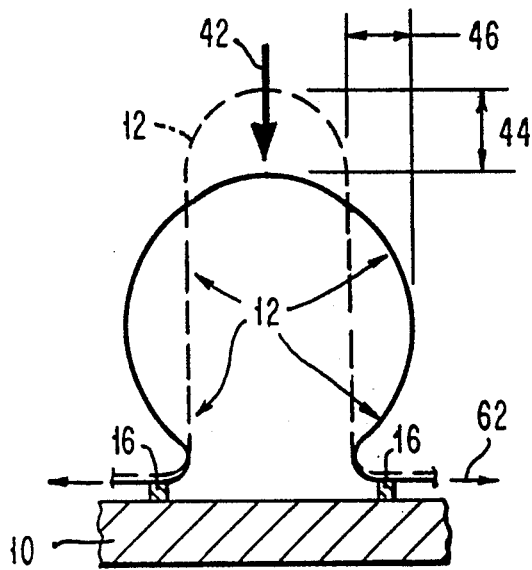
FIG. 3 is a cross-sectional view illustrating bending and buckling of an Omega shaped spring.

In the embodiment shown in FIG. 1 the springs 12 are referred to as Omega-shaped buckling springs. As shown in FIG. 3, when an external force is applied on spring 12 in the direction of arrow 42, the spring deflects vertically as shown by arrow 44 and buckles horizontally as shown by arrow 46.

Figure 7:
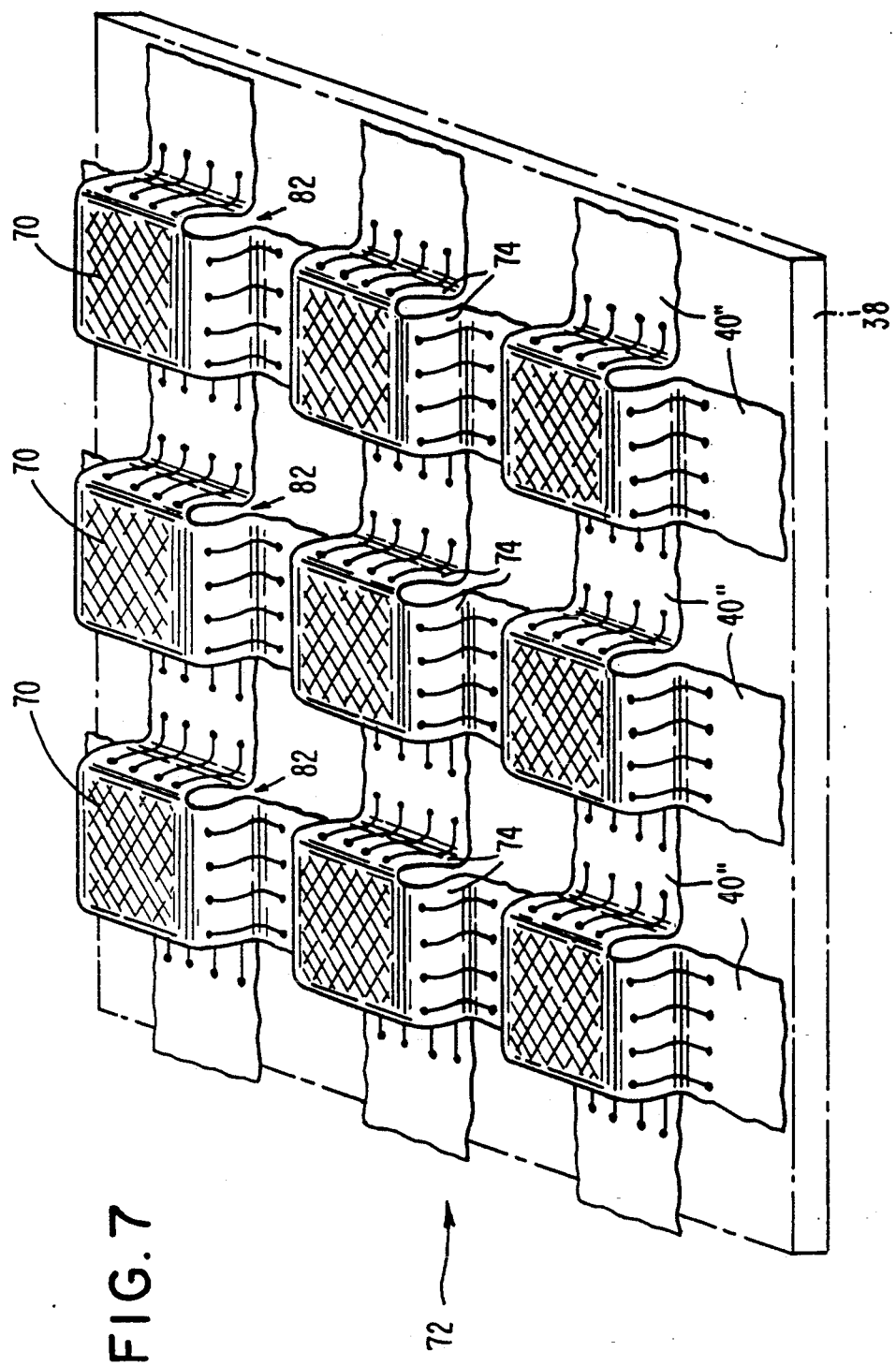
FIG. 7 is an isometric view of an array of "quad-Omega" springs comprising an array spring connector.

The adjacent springs 12 are connected to each other by isolation regions 40 and thus intrinsically form arrays as shown, for instance, in FIG. 7. Thus, unitary sheet 38 comprises an array of springs 12.

In order to better understand the principles involved in the present invention, a distinction must be made between two types of electrical connection: attachment and contact. Attachment is relatively permanent connection and typically involves a durable metallic connection, such as a solder, micro-brazing or miro-welding connection. Contact is a relatively temporary connection and implies a segmented connection between mating conductors, usually dependent upon a compressive force without the presence of a durable metallic connection.

Figure 4:
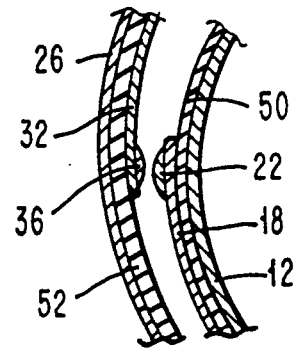
FIG. 4 is a cross-sectional view of electrical contacts forming a part of an array spring connector.

As best seen in FIGS. 4 and 5, electrical connection is made from a circuit contained on baseplate 58 to a terminal 20, through via 48, along conductor 18, and to a separable contact 22. When the spring 12, 26 is a conductive metal, a dielectric or insulating layer 50, 52 is applied to isolate the conducting layer 14, 28. Each spring 12, 26 may have one or more circuits located on baseplates 24, 58 respectively, associated therewith. As the density of circuits increases, alignment and compliance of the array spring connector becomes more critical.

In FIG. 5, each via 48 and adjacent insulating layer 50 passes through an aperture 54 in the spring 12. Thus, terminal 20 and electrical contact 22 are located on opposite sides of the spring 12.

For high frequency electrical applications, it is necessary to provide well-defined uniform electrical impedance and electromagnetic isolation from other circuits. FIG. 1 shows an electromagnetic shield 56. The shield can be the metal of the spring 12 itself, or a thin auxiliary metal layer on the surface of the spring 12. The conducting line 18, insulator 50, and shield 56 in combination form an electromagnetic transmission line.

As shown in FIG. 2, the spring layer 12 and electrically conducting layer 14 together form an overall connector unit 60. The connector unit is attached to a baseplate 58 having an array of electrical terminals 20. In some applications, the baseplate 58 is the surface of an adjacent electronic apparatus. In other applications, the baseplate 58 is an independent plate with wiring. Thus the baseplate 58 and connector unit 60 form a subassembly.

As shown in FIGS. 1 and 5 there are attachments between the overall connector unit 60 and baseplate 58. At each electronic terminal 48 there is an electronic attachment 20. At each spring support 16 there is a mechanical attachment 17. In one embodiment of the invention these electrical and mechanical attachments coincide (e.g. solder joints which do both simultaneously). In an alternative embodiment, these attachments are distinct (e.g. organic adhesive for mechanical attachments and micro-weld for electrical attachments). In another alternative embodiment the overall connector unit 60 is fabricated in situ upon the baseplate 58 so the attachments are implicit during the fabrication process.

FIGS. 1, 2 and 4 illustrate the engagement between two overall connector units 60, 60' and their respective circuits. These two connector units 60, 60' function as an array of pins and an array of sockets. Nevertheless, each unit has similar or identical structure displaced by a half cycle. In contrast, prior art pins and sockets typically had different connector structures.

The overall connector units 60, 60' are forced together by an actuator or other means. As seen in FIG. 3, the forced engagement results a vertical engagement force in the direction of arrow 42 on the head of the spring 12. By virtue of the Omega spring shape, there is a resultant horizontal buckling 46, which causes contact between electronic contacts 22, 36 located at the sides of adjacent mating springs.

As shown in FIG. 3 and FIG. 5, when a spring 12 buckles, a spring leg applies a horizontal force in the direction of arrow 62 on the spring attachment 17. An adjacent leg 14 of an adjacent spring 12 will buckle simultaneously, and apply an opposite force in the direction of arrow 66 at the next spring support 16. Through the intervening region 40 these forces will partly counterbalance each other. Therefore, less force is transmitted through the mechanical attachments 16 to the baseplate 58. The reduced force cancels in pairs. Thus a large array does not apply a large cumulative horizontal stress on the baseplate 58. However, the vertical engagement forces in the direction of arrow 42 for all springs 12 does not cancel out, and may produce a considerable cumulative total vertical force.

By contrast, typical "zero-insertion force connectors" use a "cam plate" which applies a large cumulative horizontal force.

FIG. 3 compares a spring 12 with (in solid lines) and without (in dashed lines) an engagement force. At the start of connector insertion, the springs have not yet pressed together. These is neither an engagement force nor horizontal spreading and resulting contact between springs. Thus there is nearly zero friction, even though many circuits are inserted. After insertion is completed, the vertical engagement force 42 and vertical deflection 44 cause horizontal buckling 46 and electrical contact. In contrast, certain other connectors require a significant insertion force, which increases with the quantity of contacts in the connector.

FIG. 6 is an isometric view of a single spring 70 and FIG. 7 is an isometric view of a portion of an overall connector unit 72.

Each spring 70 has what shall be referred to as a "quad Omega" shape which is four-fold symmetrical with four bendable legs 74. Each leg 74 has plural electrical terminals 76, plural conductors 78 and plural electrical contacts 80.

The spring array connector shown in FIG. 7 contains a plurality of interconnected springs of the type shown in FIG. 6. Between adjacent bendable legs 74 are separation regions 82 which assist in mechanically decoupling the adjacent legs 74. The isolation regions 40" of the connector unit 72 as shown are the mating surface for a complementary connector unit. Thus, the entire area of the connector base plate is used efficiently.

In certain connector structures, the baseplate is a ceramic printed circuit which is firmly coupled to the unitary metal spring layer 38. In applications where the connector undergoes thermal cycling, and the ceramic baseplate has a low thermal expansion and is rather brittle, and the metal spring has a large thermal expansion coefficient, the spring will expand and contract unequally with the baseplate, even though the two are rigidly attached to one another. Therefore, if both the baseplate and the springs were rigid in the horizontal plane, there would be great stress and possible cracking, particularly at the spring supports.

In order to overcome the problem, the quad-Omega spring array provides significant horizontal elasticity. Since every cross-section through spring 70 includes multiple legs 74, unequal expansion is accommodated by bending of the legs 74. An alternative solution to the expansion problem is the use of special materials, such as high thermal expansion coefficient ceramic baseplate, high strength attachment solder and low thermal expansion coefficient spring metal. However, the use of such special materials may result in a conflict with other materials requirements.

A pair of connectors perform in the same manner as an array of pins and an array of sockets found in conventional connectors. FIGS. 1 and 2 illustrate the principle. In the case of quad-Omega array spring connectors, when two connectors are in force engagement, insofar as there is typically a slight sideways misalignment and the four mating springs will produce sideways or horizontal forces which do not cancel. Thus, there is a net force which counteracts the misalignment. If there is also a slight vertical misalignment, a corresponding perturbation in the spring force will be manifest. Since the connector units 72 are flexibly mounted, any abnormal force causes a slight displacement. Thus a mated pair of connector units 72 will self-align and hence compensate for any misalignment.

In the case where there is a rotational misalignment of the springs in the plane of the baseplates, the resultant torque on the springs comprising the connector will cause the floating connector to slightly rotate in its flexible mounting and hence self-align with the fixed connector.

Similarly, if there is a misalignment in the vertical position or between the vertical axis of a pair of connector units, the resultant forces of all the springs in the floating connector will cause a slight rotation and deflection in its flexible mounting and hence self-alignment with the fixed connector.

In each case, the floating connector will adjust to self-align and eliminate almost all of any misalignment with the fixed connector.

In addition to misalignment errors, it is possible for a connector to have internal geometric perturbation, for instance due to manufacturing tolerances resulting in erroneous spring location. If the error is not too large, compensation and connection are possible by bending individual spring legs 74 of a spring 70.

The above described array spring connectors can be fabricated by the following procedure. A three-dimensional mandrel to define the inner surface shape of the spring 12 is covered with a coating material. Fabricate the spring 12 on the mandrel, including the aperture 54 through which vias 48 will pass and the isolation regions 40. An insulating layer 50 is applied on the spring 12. A conducting layer 14 is then applied on the insulating layer 50 at predetermined locations. Metallurgy for contacts 22 are fabricated at one end of each conducting layer. Preferably the various mentioned layers are applied by means of respective masks.

It will be apparent to those skilled in the art that the order of applying the layers 14 and 50 may be reversed so long as the conducting layer is insulated from the spring 12 in the final construction.

The spring layer is then aligned in a vacuum chuck. A vacuum is applied, the coating material is melted and the mandrel is removed. The spring layer is then cleaned in a solvent which dissolves any residual coating or resist.

After the mandrel is removed, there is access to the bottom surface of the springs and their respective apertures 54. Through these aperture, the bottom of the insulation layer 40 is accessible.

Holes are opened for the vias 48 through the insulating layer 50. Into these holes metallurgy for the vias 48 is added. Additional metallurgy is added at the bottom of the vias 48 for the terminals 20.

Concurrently with the foregoing steps, the baseplate 58 is fabricated. The connector unit 60 is aligned and attached to the baseplate 58. Finally the vacuum chuck is released from the connector assembly.

It is possible to perform some of the above steps according to a 3D electro-chemical fabrication process similar to those used in the fabrication of printed circuits and integrated circuits.

It will be apparent to those skilled in the art that many springs are fabricated simultaneously, as one global or unitary layer, as an intrinsic array. Also, all the conducting lines are fabricated simultaneously. Thus the effort to fabricate the spring array connector is small compared to the quantity of circuits. Also, lithographic processes facilitate fine geometry and a high density of contacts. By contrast, conventional connectors typically are fabricated from discrete pins and discrete sockets which are then assembled into arrays.

The spring layer 38 requires use of a resilient material. In the preferred embodiment the material selected is a springy metal (i.e. having a large yield stress and a large yield strain) which also can be readily deposited. Two examples are nickel 96%—phosphorus 4% and nickel 97%—cobalt 3%.

Other embodiments include a crystaline covalent material (e.g. mono-crystal or poly-crystal silicon), an amorphous covalent material (e.g. glass or amorphous silicon), or a very strong polymer material. Each material has a finite yield strength, which limits the allowable bending regime. Beyond this limit, the material degrades by inelastic fatigue, inelastic deformation or fracture. In general, the pure copper used for most electronic printed circuits has low yield strength, so is less suitable than springy metals. It will be apparent to one skilled in the art that known specific processes are required, appropriate to each specific material used.

Nominally, the Omega shape spring is "non moldable". That is, a rigid mandrel could not be removed from within a rigid Omega-shaped spring 12.

A solution to the problem is to make a mandrel and spring 12 in the shape of an inverted U. This shape is moldable. As shown in FIG. 3, the resultant spring assumes an Omega shape by buckling during elastic bending.

Another solution is to make an array of inverted U shapes. After fabrication and attachment of the baseplate, a single application of a large force completes the array. The application of a large force in elastically deforms the spring and produces an Omega shaped spring.

A further solution is to use an Omega shaped mandrel. As the mandrel is withdrawn, the spring legs elastically spread to permit the mandrel to be removed.

The above solutions may be combined. Indeed similar techniques are common in molding of other elastic objects, such as rubber.

Another solution is to use a "sacrificial" mandrel such as in known in the art of "lost wax" casting.

The exposure system used to fabricate the spring array must support process requirements. The process involves relatively coarse resolution, a 3D workpiece and a large depth of field. Optics teach appropriate exposure techniques, which are outside the scope of this patent. These requirements suggest light with high brightness but medium wavelength which constrains the photo-chemistry of the resist system.

Each tool includes means for accurate alignment. Some examples are conical pins and holes for mechanical alignment, or target patterns for optical alignment.

Alignment is important, especially if the wiring layer is dense. In order to minimize alignment errors, the resilient layer is accurately held during each transfer of the process from the mandrel, to the vacuum chuck and to the baseplate. It is necessary to turn on and to turn off adhesion to the nascent connector unit 60. The vacuum chuck controls adhesion by switching between vacuum and air. The mandrel controls adhesion by a release/hold coating.

For example, there are many a suitable organic compounds which melt at a temperature in the range between 90 and 170 C., are non-corrosive, dissolve readily in an organic solvents, and do not dissolve in water nor plating solutions. Similar materials can be used for a sacrificial mandrel.

Alternatively, connector unit 72 can be fabricated from a flat deposition and etching process, followed by a die forming process. A flat, planar connector unit with a flat spring layer and flat wiring layer can be fabricated (FIG. 8) using technology similar to that used for fabricating a flexible printed circuit. The connector unit is die formed using a 3-D die. The formed connector is then attached to a baseplate.

Figure 8:
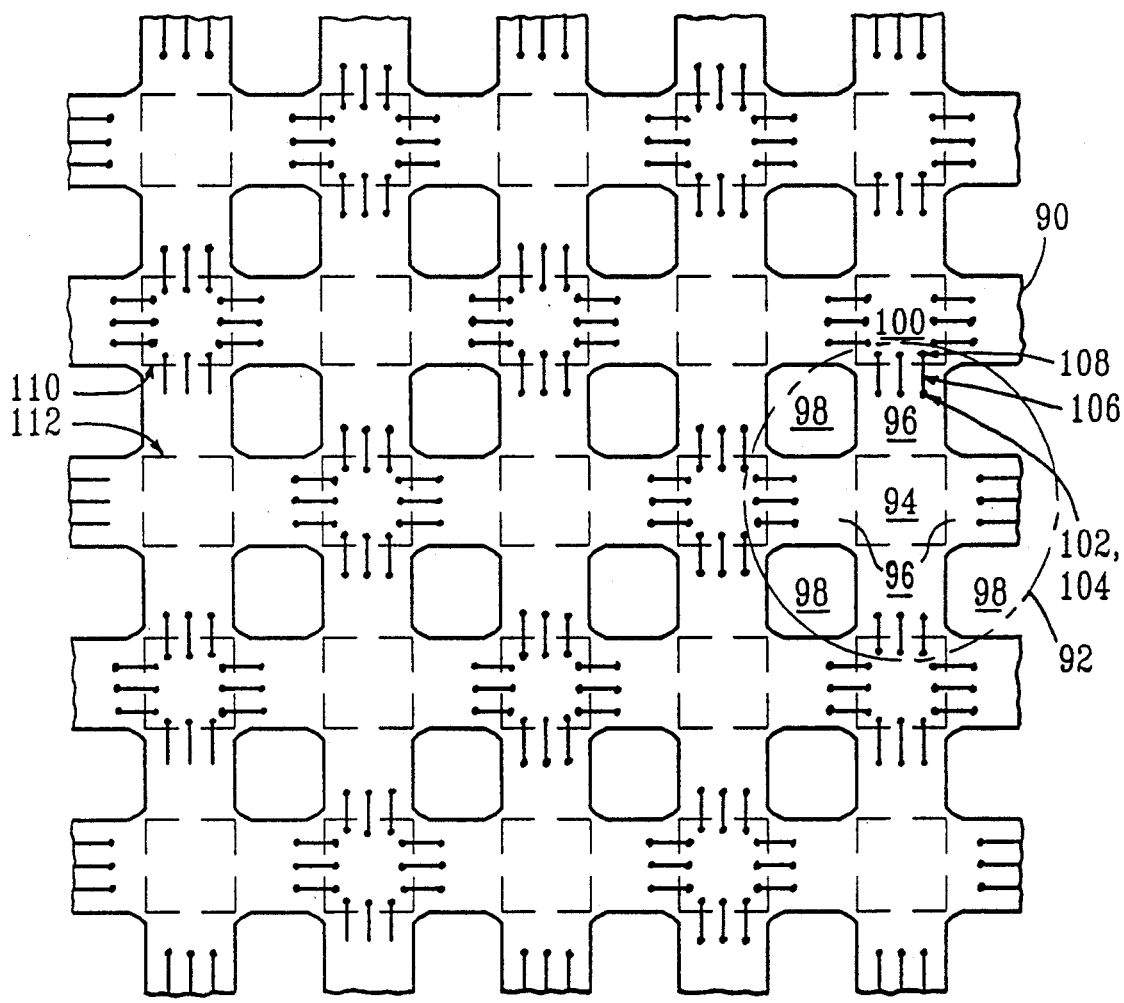
FIG. 8 is a plain view of a partially fabricated flat spring layer.

FIG. 8 illustrates a flat connector 90. Each spring 92 has a "top" portion 94 surrounded by four legs 96 and four separation regions 98. Lines 100 are located between four legs 96 of four neighboring springs 92. The connector contains terminals 102, vias 104, conducting lines 106 and electrical contacts 108. The dashed lines 110 are bent upward and the dashed lines 112 are bent downward.

Figure 9:
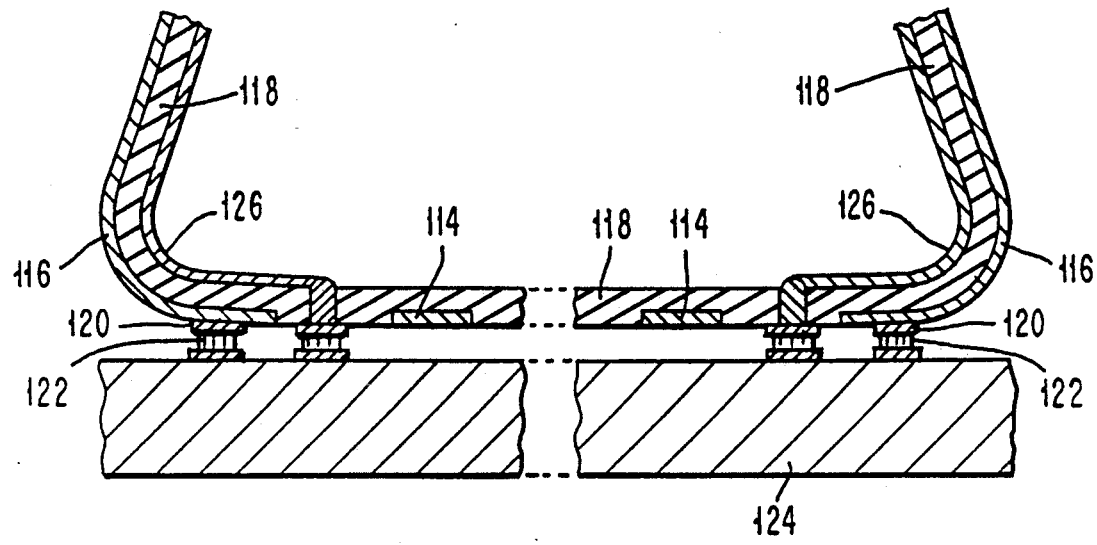
FIG. 9 is a cross-sectional view illustrating the connection of a spring to a baseplate in an alternative embodiment of the invention.

FIG. 9 illustrates an alternative embodiment of the invention in which the links or isolating regions 114 between the springs 116 are located within the insulating layer 118. In the embodiment shown in FIG. 1 the isolating regions 40 were part of the springs 12. The structures in FIG. 1 and FIG. 9 are similar. However, the isolating regions 114 are relatively soft which weakens pair-wise cancellation of the horizontal forces between adjacent springs. Thus spring support 120 and attachment 122 must be able to withstand a greater lateral force.

Figure 10:
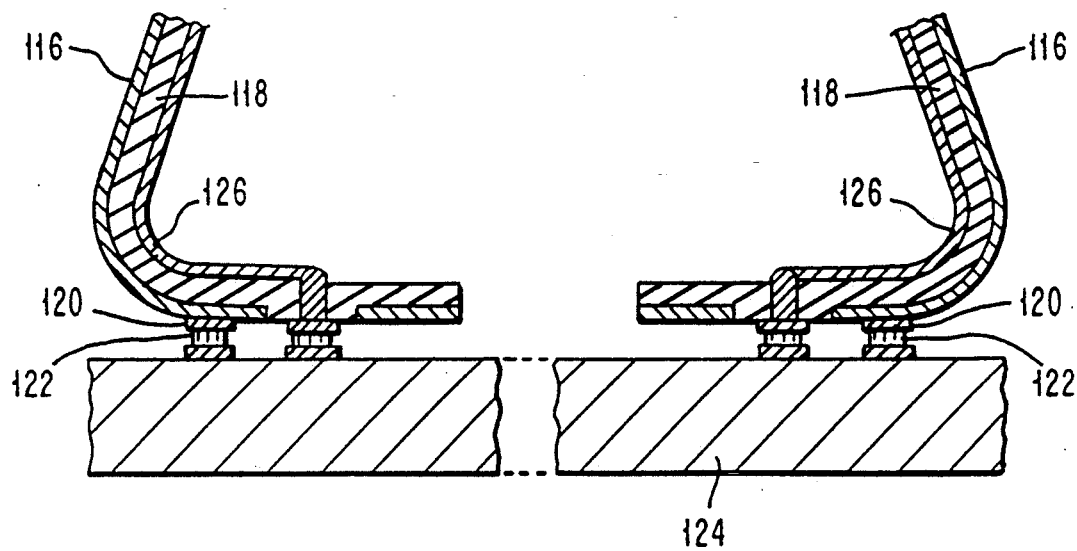
FIG. 10 is a cross-sectional view illustrating the connection of a spring to a baseplate in an alternative embodiment of the invention.

FIG. 10 illustrates an alternative embodiment of the invention in which there are no isolating regions between springs. The springs are connected by means of attachments 120, 122 to the baseplate 124. Across the global array, all of the springs 116 are simultaneously fabricated. Subsequently all of the conducting lines 126 are simultaneously fabricated. The springs are fabricated as a unitary global springy layer and the conducting lines 126 are fabricated from a unitary global conducting layer. Also, on the top of each quad-Omega spring there are metal contacts mechanically connected by means of a small but unitary spring.

In a further alternative fabrication method, the array spring connection is fabricated by 3-dimensional deposition upon a sacrificial mandrel. In certain applications, the method can be performed upon a sacrificial mandrel directly in situ upon the baseplate.

The tools and process are generally the same as those described above with the major difference being the use of a mold instead of a mandrel and the use of molding material rather than a mold or release coating.

Briefly, the process commences with a cast sacrificial mandrel disposed directly upon the baseplate using the mold and molding material. A resilient layer including mechanical attachments and a wiring layer with electrical attachments are fabricated, for instance by 3 dimensional deposition upon the sacrificial mandrel. The sacrificial mandrel is removed from inside the resilient layer by means of a solvent or melting. The liquid can flow through the separation regions 82 as shown in FIGS. 6 and 7.

The in situ fabrication method eliminates certain alignment and transfer steps thereby allowing increased connector density. However, there are limitations to the use of the in situ process, such as the baseplate being chemical incompatible or being mechanically too delicate.

Figure 11:
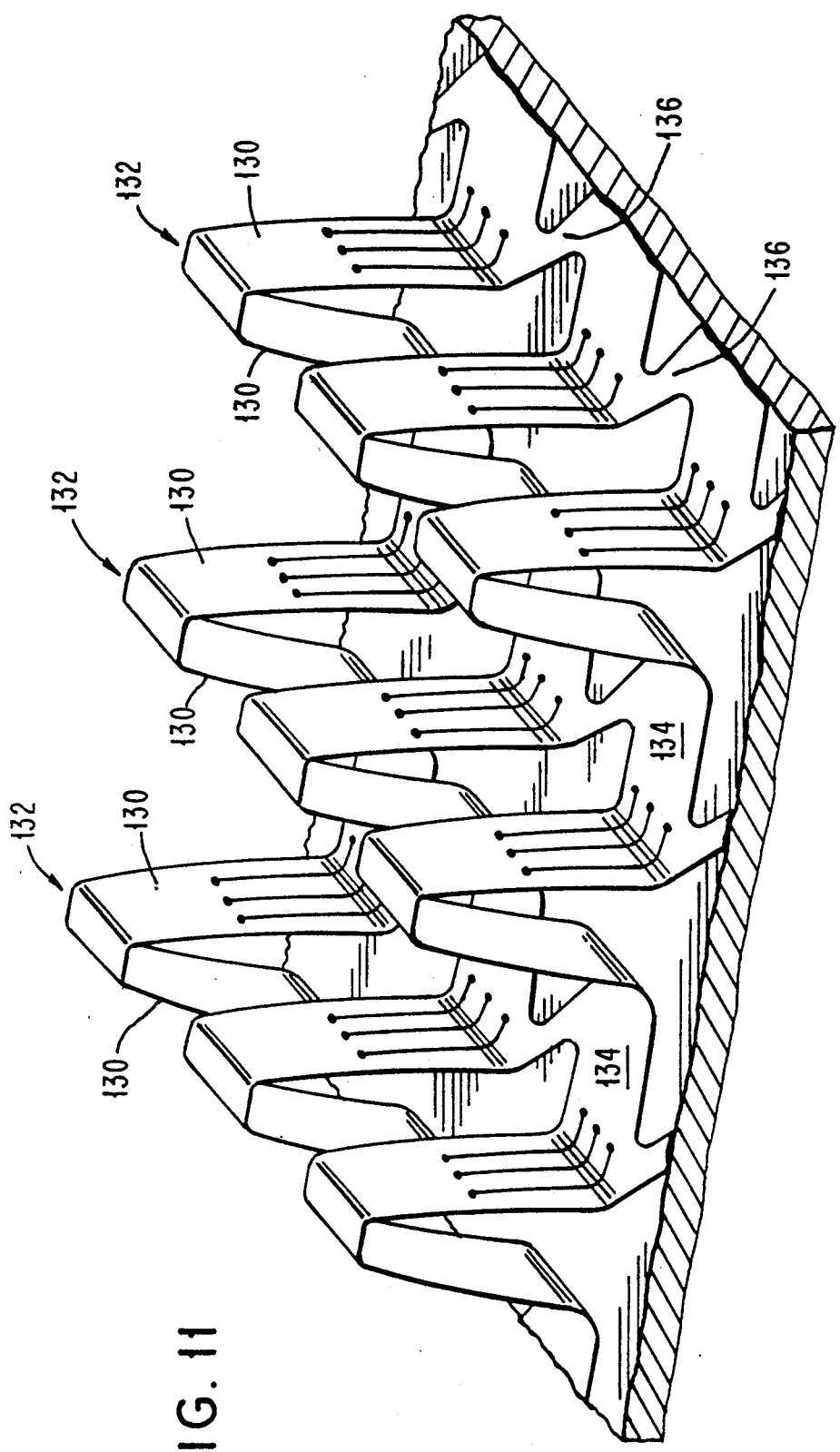
FIG. 11 is an isometric view of an alternative embodiment of the invention comprising "dual-Omega" springs.

FIG. 11 illustrates an isometric view of a resilient spring layer with an array of "dual-Omega" springs. The dual-Omega spring includes a pair of upstanding legs 130 per spring 132. For graphical clarity the spring 132 is shown its uncompressed state, which resembles an inverted U shape. In its compressed state, the spring resembles the Omega shape shown in FIG. 2.

The springs 132 are disposed in a two-dimensional array of rows and columns. Along each row there are links 134 between adjacent springs in each row. Along each column there are links 136 between adjacent springs in each column. The links permit independent bending of each spring.

The dual-Omega spring array is a simpler shape to form than the above described quad-Omega spring array. However, the dual-Omega spring allows fewer electrical contracts per unit base area for the same center-to-center pitch between springs and for the same center-to-center pitch between conducting lines.

It will be apparent to those skilled in the art that variations and modifications to the described link arrangement between springs are possible.

Figure 12:
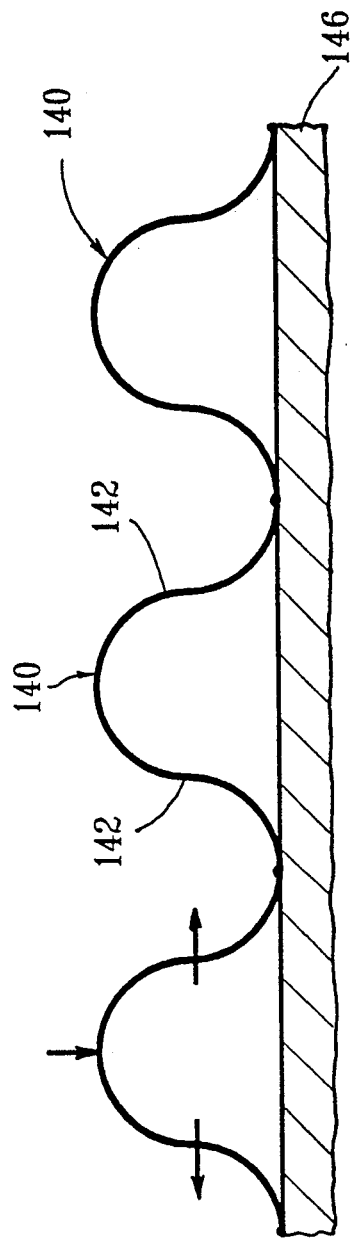
FIGS. 12 through 14 are cross-sectional views of alternative embodiments of the inventions illustrating differing spring geometries useful in practicing the invention.
Figure 13:
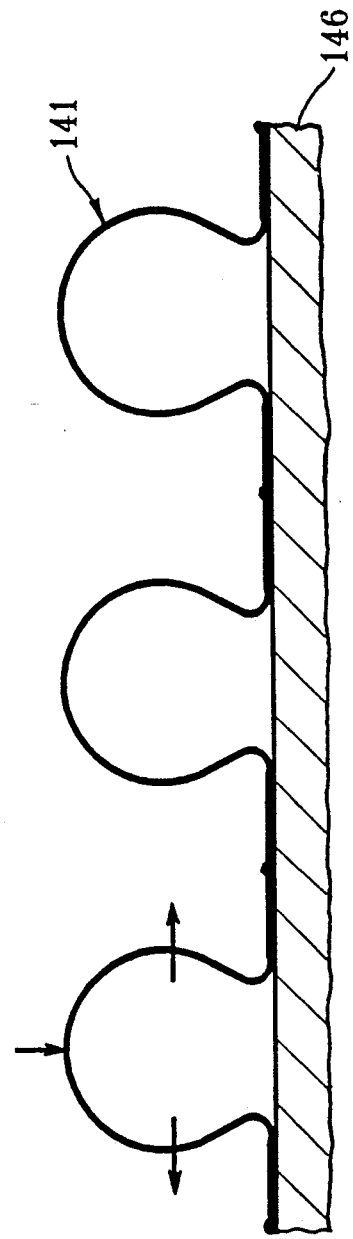

An alternative embodiment of the invention is shown in FIG. 12 where undeflected resilient members 140 approximate the shape of a sine wave. Each spring has two legs 142 and the spring array performs in substantially the same manner as the dual-Omega spring array described above. FIG. 13 shows a resilient spring member 141 in the form of the Greek letter Omega. FIGS. 16 through 20 show cross-sectional views of similar shaped springs as will be described below.

Figure 14:
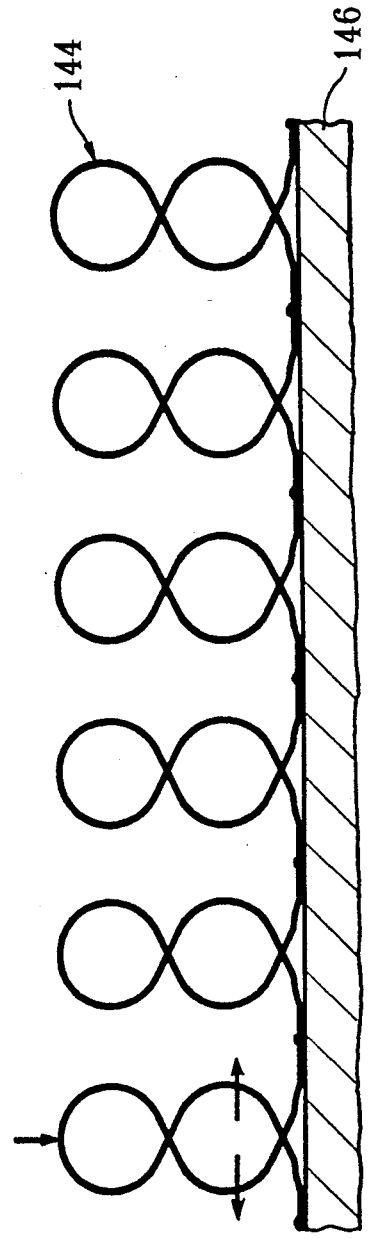

Another form of spring useful for practicing the present invention is a "pleay" shape spring 144. Such a spring array connector including a baseplate 146 is shown in FIG. 14.

While the above spring arrays were described in conjunction with rectangular arrays having orthogonal rows and columns, other arrays may be used.

Figure 15:
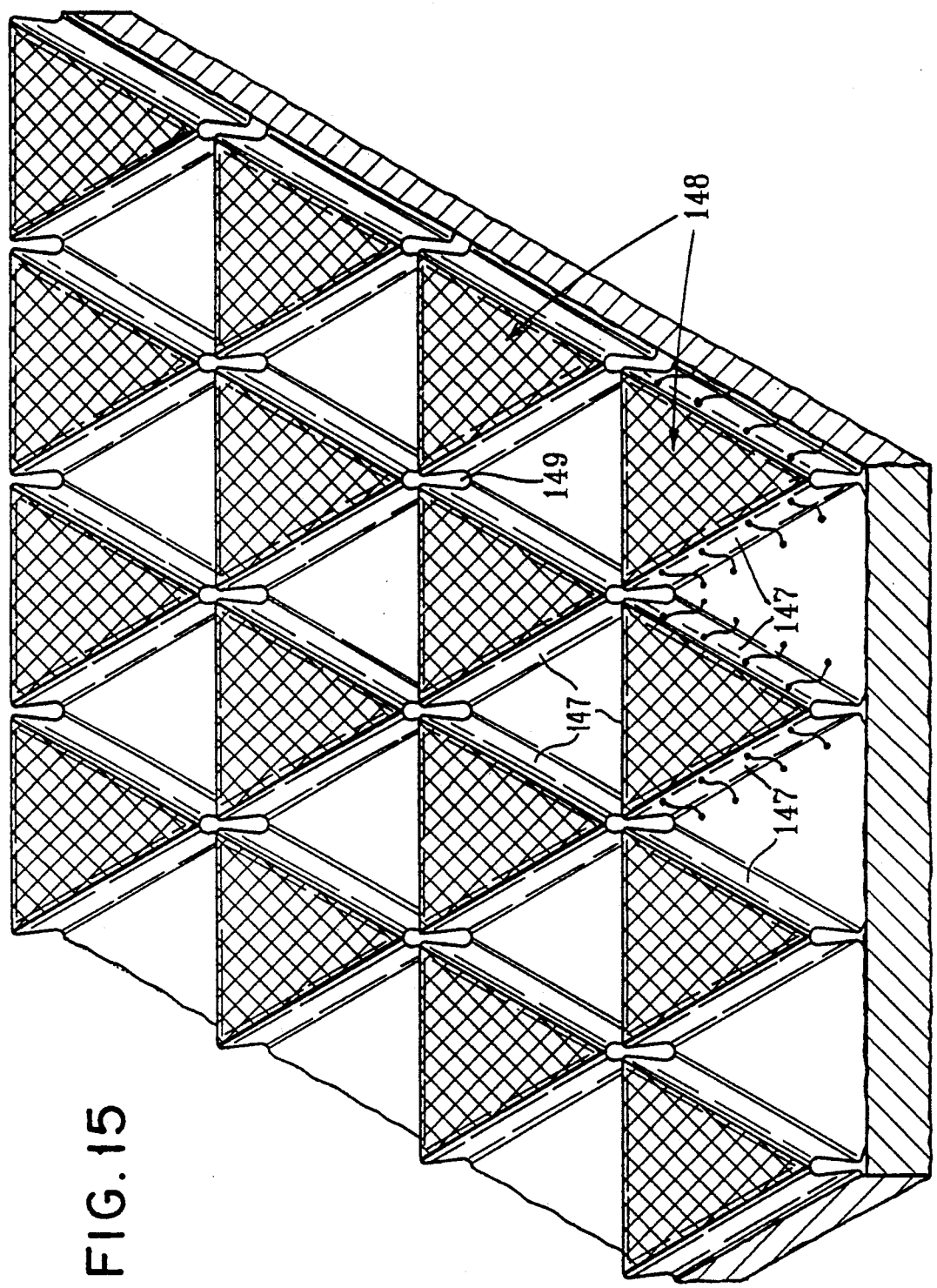
FIG. 15 is a cross-sectional view of an alternative embodiment of the invention.

In another embodiment, a tri-Omega shape spring 148 having three legs 147 connected in the shape of an equilateral triangle is used. The array is in the form of a triangular grid with springs located along lines disposed at 0 degrees, 120 degrees and 240 degrees as shown in FIG. 15. Between adjacent legs 147 are isolation regions 149 which assist in mechanically decoupling the adjacent legs, and accomodate the mating springs.

In certain applications, the connector can be customized for particular signals and for power circuits. For example, power circuits can have wider electrical contacts, conducting lines and terminals on wider spring legs. The result is a less dense connector. Signal circuits can have narrower springs, electrical contacts, conducting lines and terminals on narrow springs resulting in greater circuit density.

In other applications, certain circuits and springs are unnecessary and may be deleted from the spring array connector. In still other applications, a single baseplate may be connected to several smaller connector units.

In applications where contact corrosion or oxidation presents a potential problem, a small amount of "contact wipe" or rubbing during insertion is beneficial. When there is a large quantity of contacts, the simultaneous rubbing of all the contacts will result in an excessive force. In order to avoid the problem, springs with graded geometries are employed within the array. The springs may be graded by location or width so that the wipe occurs sequentially across the array as the insertion force remains moderate.

Sequential insertion and sequential separation can be provided by sequential actuation force across the array. For example, if baseplate is bendable, the actuator can slide across the connector unit. Such an embodiment will be described below in conjunction with FIG. 23.

In addition, when more complex spring action is desirable, the art of springs and switches teaches many methods of customizing spring deflection as a function of force. Thus the following characteristics can be designed into the springs: controlled deflection at onset of buckling, zig-zag sideways bending, vertical snap action, horizontal inter-locking action and other complex action during insertion and separation.

In order to accomplish certain of these actions, an actuator or other force applying means is used to apply a force to initiate connector contact. Thereafter, even when the force is removed, the connector will remain connected. In order to initiate separation, an actuator or other force means must apply a force which reverses the action of the previously applied engaging force.

Actuators for applying an engagement force for the connectors can vary for each embodiment. For example, when the baseplate is particularly fragile or when there are very many springs in the array, an actuator which applies a minimal engagement force is desirable.

Pneumatic actuation is an embodiment for the actuator. In some spring arrays, the insulating layer 50 is a thin flexible layer, such as plastic, which forms a moderately air-tight "balloon". As shown in FIG. 5, the spring layer contains apertures 54 for isolation regions 40. These apertures can be spanned by a thin flexible insulation layer without impeding the spring action. In the overall connection unit 60 and baseplate 58 small pneumatic channels can be included which connect the balloons to a central pneumatic port. Thus, springs can be laterally spread by pressure and laterally contracted by suction.

The present invention is useful for electrically connecting a lower baseplate 150 to an upper baseplate 152. For convenience, the following description will be described in conjunction with sine wave springs 154 and 156 shown in FIGS. 16 and 17. A circuit located on the lower baseplate 150 is connected through electrical attachments 158, through connector unit 160 to electrical contacts 162. In a like manner, a circuit contained on the upper baseplate 152 is connected through electrical attachments 164, through connector unit 166 to electrical contacts 168.

Figure 16:
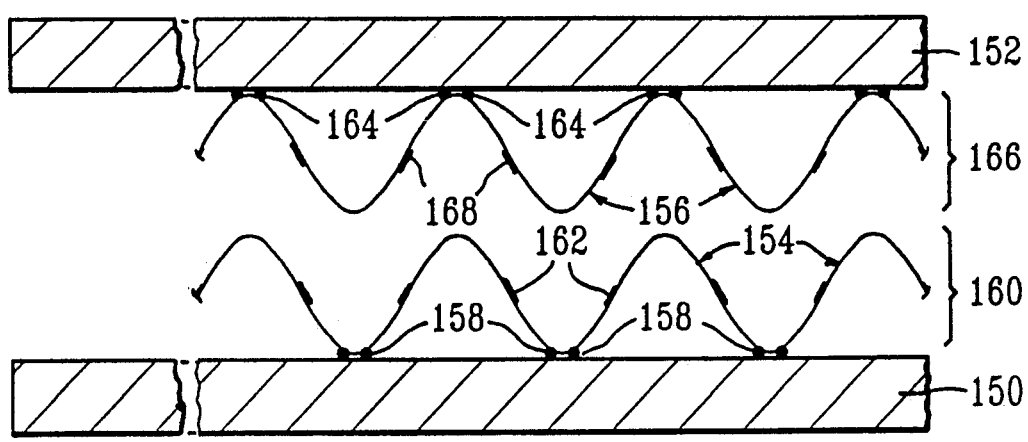
FIGS. 16 through 20 are cross-sectional views of further alternative embodiments of the invention.

In the preferred embodiment shown in FIG. 16 the electrical contacts 162, 168 are located approximately at the mid-point of each leg of the respective springs 154, 156 and are engaged by sideways spreading of the spring. Thus, the connectors 160, 166 act as an array of compliant pins mating with an array of compliant sockets. The combination includes considerable ability for horizontal (lateral) self-alignment. The springs are self-aligning in the vertical or engaging direction. The embodiment shown provides for maximum electrical contact density.

Figure 17:
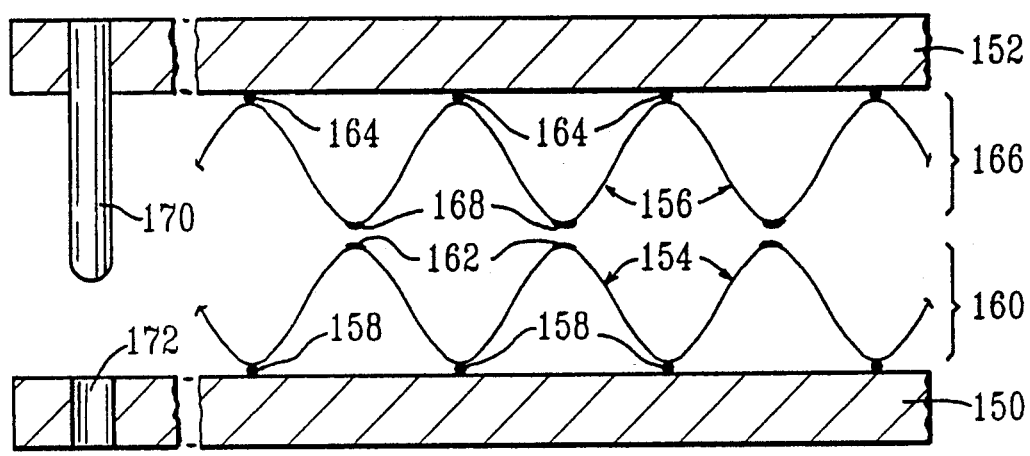

In an alternative embodiment shown in FIG. 17, the electrical contacts 162, 168 are located at the peaks of the respective springs 154, 156 and the springs engage by vertical motion. The result is a combination having much vertical compliance but reduced electrical contact area. The arrangement is inherently self-aligning in the mating direction. However, the combination has minimal intrinsic horizontal or lateral self-alignment. Therefore, extrinsic alignment means, such as guide pins 170 connected to baseplate 152 and sockets 172 in the other baseplate unit 150, are provided for lateral alignment of the connectors.

Figure 18:
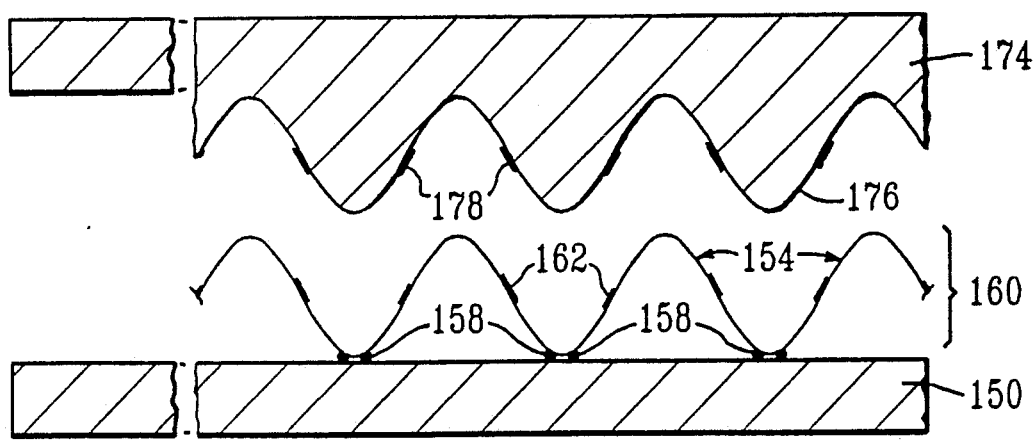

FIG. 18 illustrates an alternative embodiment including a single overall connector unit 160 in direct contact with a contoured baseplate 174. The contoured surface 176 of baseplate 174 is made to match the contour of connector unit 160. Electrical contacts 178 are located directly on the contoured surface 176 of the baseplate 174.

The contoured surface 176 can either be congruent with the shape of spring 154 as shown, or the surface 176 can be shallower than the spring 154 so that just a small region of the surface of spring 154 containing contacts 162 is in contact with the surface 176 and contacts 178 respectively.

Figure 19:
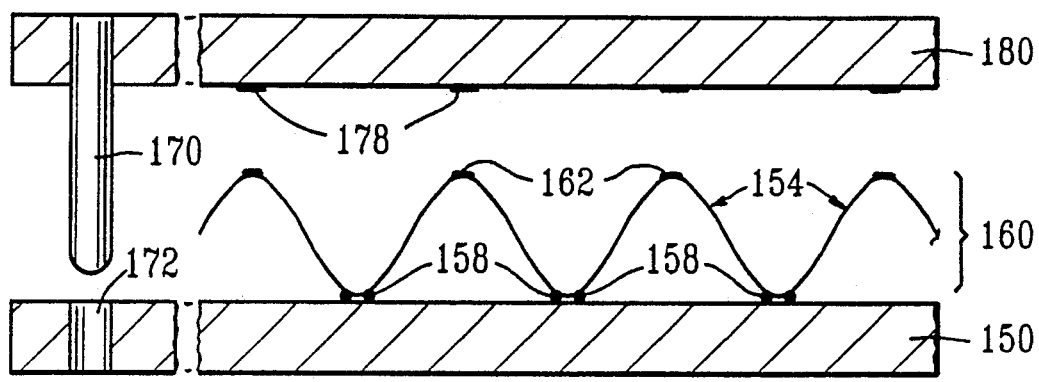

In other cases, the surface of the baseplate 180 can be planar with electrical contacts 178 connected thereat as shown in FIG. 19 for contacting contacts 162. Extrinsic alignment devices, such as pins 170 and sockets 172 are required to provide lateral alignment of the connector portions.

Figure 20:
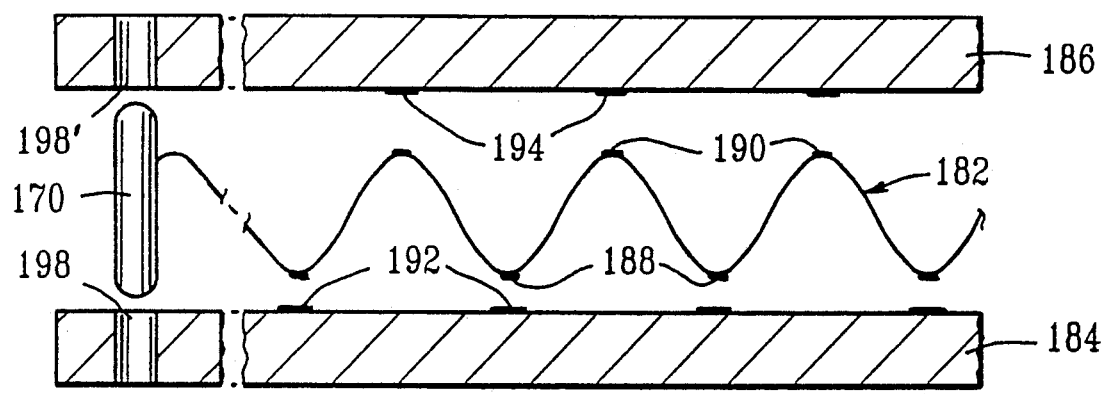

FIG. 20 shows an alternative embodiment including a spring member interposer 182 which is disposed between, but not attached to, either planar baseplate 184, 186. Electrical contacts 188 and electrical contacts 190 are located at the peaks of the interposer 182. Associated electrical contacts 192 on the surface of baseplate 184 and electrical contacts 194 on the surface of baseplate 186 are located to matingly engage electrical contacts 188 and 190 respectively when the backplates 184 and 186 are urged toward one another. Since there is an absence of intrinsic lateral alignment, an extrinsic pin 170 connected to interposer spring 182 is aligned with sockets 198 and 198' in baseplates 184 and 186 respectively for providing lateral alignment.

Figure 21:
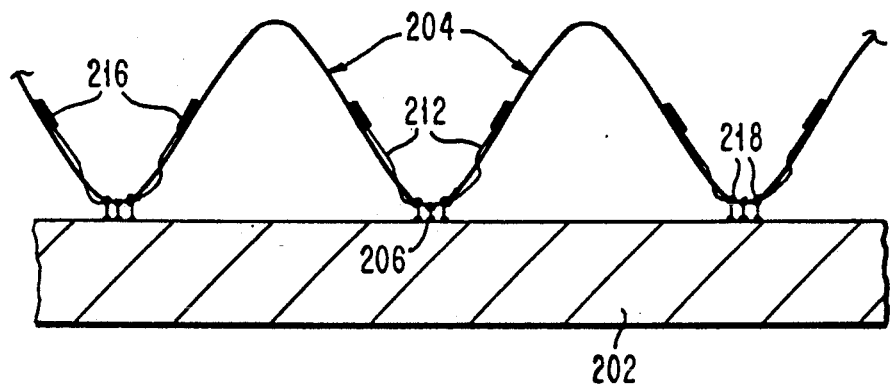
FIGS. 21 and 22 are cross-sectional views of embodiments of the invention in which the array spring connector comprises wire.
Figure 22:
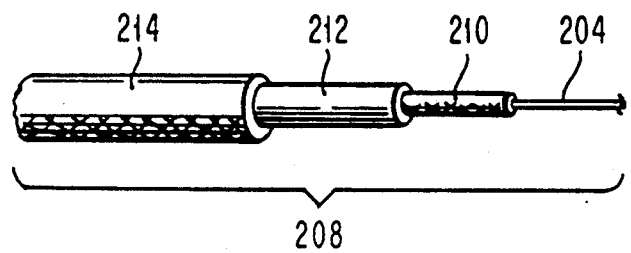

The general principle of the present invention can be expanded to the use of a resilient wire as the spring layer. FIG. 21 shows a cross-sectional view of a resilient wire spring array connector including baseplate 202 and helical coil or flat sine wave shaped spring layer 204. A pair of spring anchors 206 mechanically connect each separate bendable spring having two legs to the baseplate 202. As seen in FIG. 22, the wire spring 204 is coated with a plurality of layers 208 which comprises an insulating layer 210, a conducting layer 212 segmented into sections, an outer insulating layer 214, electrical contacts 216 and attachment terminals 218. Thus, an electrical circuit located on baseplate 202 is connected by means of electrical attachment 218 and conducting layer 212 to electrical contact 216. The combination of spring wire 204 and layers 208 form a spring array connector.

The wire spring array connector described in conjunction with FIGS. 21 and 22 can be used with either sine wave or helix coil shapes in several orientations, analogous to those shown in FIG. 16 to 20.

Figure 23:
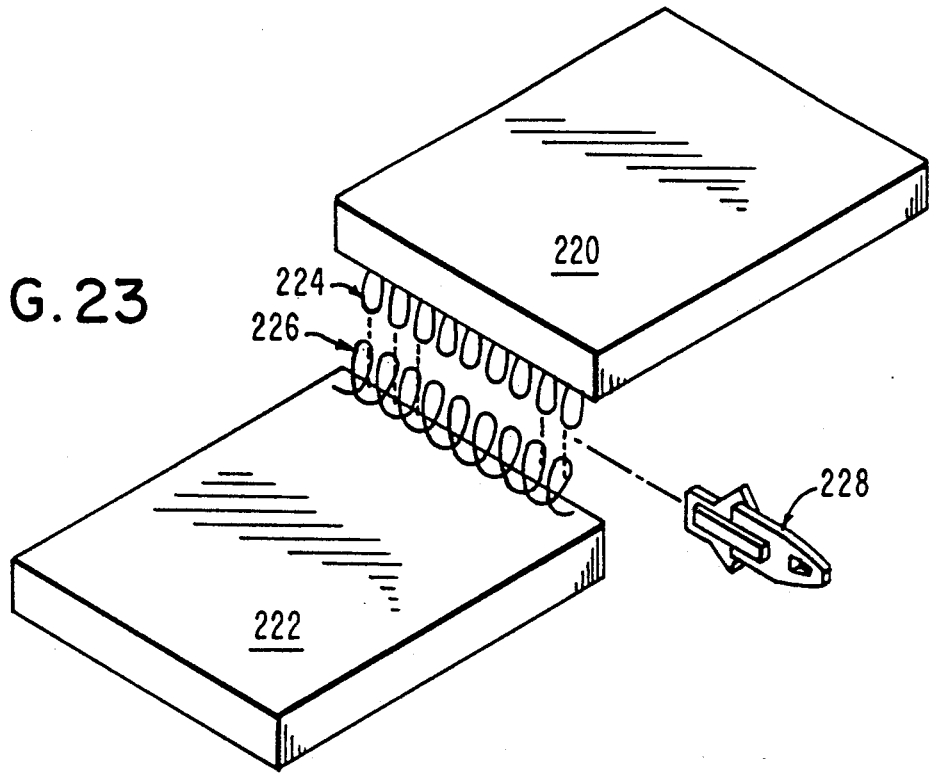
FIG. 23 is an isometric view of a right-angle edge connector corresponding to the spring connectors shown in FIG. 16 and 21.

FIG. 23 is an isometric view of a right-angle edge connector corresponding to the spring connectors shown in FIGS. 16 and 21. Baseplates 220, 222 include at their respective edge regions respective helix wave shaped wire spring array connectors 224, 226. Connectors 224 and 226 engage perpendicularly to each other and disengage from each other by means of sliding actuator 228. Each base plate contains a single row connector rather than a two dimensional array of springs.

In FIG. 23 the spring resembles the general shape of a clothing zipper. Two such helix coil connectors 232 can be connected to one another by means of a sliding actuator in order to sequentially engage and disengage the two helix coils, much the manner of a zipper. In such an arrangement the baseplates are made sufficiently flexible to accommodate the engagement/disengagement. The precise geometry of the coils determine at which locations along the coil the two coils will come into contact. The geometries and positions of the electrical contact, electrically conducting line and electrical terminal are designed and located accordingly.

Figure 24:
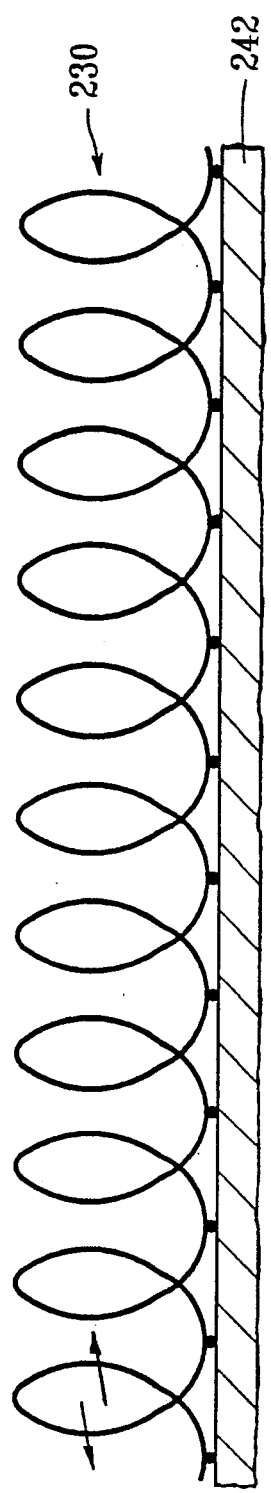
FIGS. 24 through 27 are cross-sectional views of alternative spring configurations useful in practicing the present invention.
Figure 25:
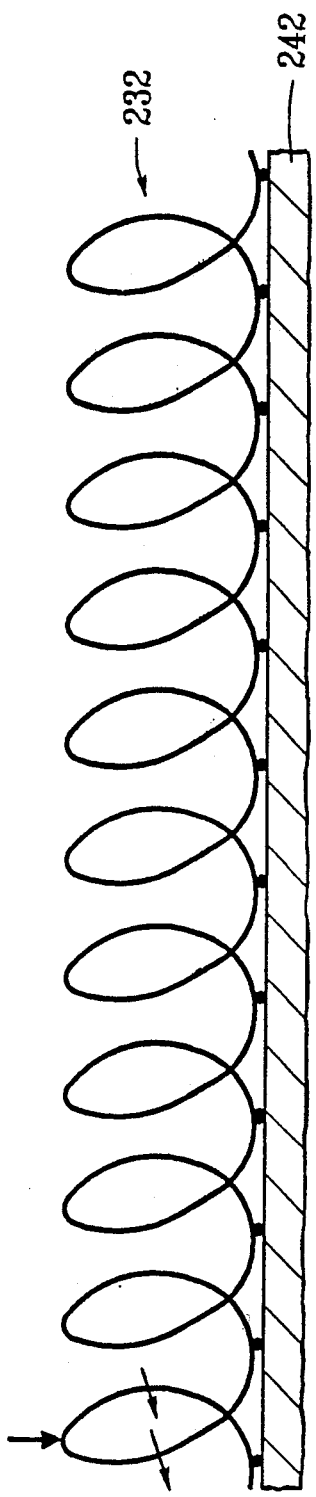

FIG. 24 is an isometric view of a single helix shape coil connector 230 unit connected to a baseplate 242. The helix shape permits a more linear density than a flat sine shape coil. The coil 232 in FIG. 25 differs from the coil 230 by coil 232 having a skewed helix shape.

It will be apparent to those skilled in the art that further modification and variations of spring shapes are possible without deviating from the teachings of the invention.

Figure 26:
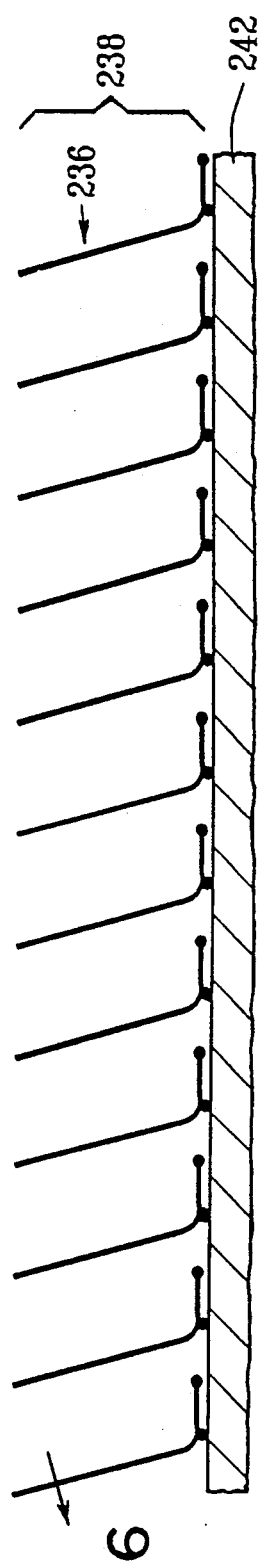

Another embodiment of the invention relies upon cantilever bending rather than beam buckling for making connector contact. FIG. 26 shows an array of near-vertical cantilever springs 236 forming a spring layer 238 of a connector connected to a baseplate 242. The engagement force, deflection and actuation force are each applied in a direction approximately horizontal to the spring array as shown. Extrinsic alignment, for instance, pin and socket (not shown) is used to provide alignment of the connectors.

Such an array is fabricated by etching a flat sheet, adding printed wiring layer, die-forming and folding the sheet and then attaching the sheet to a baseplate. Die-forming and folding permits the vertical cantilever length to be significantly longer than the horizontal distance between adjacent springs thus facilitating greater array density.

Figure 27:

FIG. 27 illustrates an array of near-horizontal cantilever springs 240 connected to a baseplate 242. The engagement force, displacement and actuation are each directed vertically, in a direction approximately normal to the top surface of the baseplate 242. Adjacent cantilever springs 240 partly overlap in order to increase the spring density. Near-horizontal cantilever springs are planar which simplifies fabrication.

While there has been described and illustrated a preferred embodiment of the invention and several modifications and variations thereof, it will be apparent to those skilled in the art that further modifications and variations are possible without deviating from the broad principles of the present invention which shall be limited solely by the scope of the claims appended hereto.

What is claimed is:

1. A two-dimensional array spring connector comprising:
   unitary resilient member means comprising a unitary two-dimensional array of independently bendable springs, at least some of said springs having means for horizontally moving in at least one direction upon being vertically deflected;
   a plurality of first electrical contacts electrically isolated form one another and mechanically coupled to said unitary resilient member means; complementary unitary resilient member means having a shape for engaging with said unitary resilient member means; and
   a further plurality of electrical contacts electrically isolated from one another and mechanically coupled to said complementary unitary resilient member means disposed for electrical contact with said plurality of first electrical contacts when said unitary resilient member means is engaged with said complementary unitary resilient member means, said further plurality of electrical contacts being located adjacent said springs such that during engagement of said unitary and complementary unitary resilient member means said springs are vertically deflected to horizontally move said first electrical contacts into electrical contact with said further plurality of electrical contacts.

2. A two-dimensional array spring connector as set forth in claim 1 wherein said springs have shapes selected from the group consisting of sine wave, helix, cantilever, buckling beam, omega-shaped and pleay-shaped.

3. A two-dimensional array spring connector as set forth in claim 1, further comprising actuation means coupled to said unitary resilient members means and said complementary unitary resilient members means for causing engagement of said unitary resilient member means and said complementary unitary resilient member means.

4. A two-dimensional array connector as set forth in claim 1, further comprising a first baseplate, wherein said plurality of first electrical contacts are electrically connected to an associated electrical circuit disposed on said baseplate; and
   a second baseplate, wherein said further plurality of electrical contacts are electrically connected to an associated electrical circuit disposed on said second baseplate.

5. A two-dimensional array spring connector as set forth in claim 4, further comprising:
   insulating layer means disposed on said unitary resilient member means and said complementary unitary resilient member means; and
   conducting layer means disposed on said insulating layer means for electrically connecting said plurality of first electrical contacts to said associated electrical circuit disposed on said first baseplate and for electrically connecting said further plurality of electrical contacts to said associated electrical circuit disposed on said second baseplate.

6. A two-dimensional array spring connector as set forth in claim 5, further comprising electromagnetic shield means.

7. A twodimensional array spring connector as set forth in claim 1, further comprising electromagnetic shield means.

8. A connector as in claim 1 wherein the unitary resilient member means is comprised of a thin sheet layer of resilient material.

9. A two-dimensional array spring connector comprising:
- a first baseplate having a first array of electrical terminal means;
- a second baseplate having a second array of electrical terminal means;
- a first unitary resilient member means comprising a first thin sheet layer of resilient material having a first two-dimensional array of independently movable springs coupled to said first array of electrical terminals and having first electrical contact means;
- a second unitary resilient member means comprising a second thin sheet layer of resilient material having a second two-dimensional array of independently movable springs coupled to said second array of electrical terminals and having second electrical contact means, and
- said first electrical contacting means and said second electrical contact means being disposed for contacting each other when said first unitary resilient member means is engaged with said second unitary resilient member means.

10. A two-dimensional array spring connector as set forth in claim 9, wherein said springs have shapes selected from the group consisting of sine wave, helix, cantilever, buckling beam, omega-shaped and pleay-shaped.

11. A two-dimensional array spring connector as set forth in claim 9, further comprising actuation means coupled to said first baseplate and said second baseplate for urging said first unitary resilient member means into engagement with said second unitary resilient member means.

12. An electrical connector comprising;
- a spring suitably shaped to outwardly expand along a first plane in at least two different directions upon being compressed in a third direction substantially orthogonal to the first plane; and
- electrical conductors connected to an exterior of the spring, each conductor having a first end proximate a first end of the spring and a second end on an exterior side of the spring, wherein upon compressing the spring in the third direction, the spring expands in the first plane in the at least two different directions to outwardly deflect the conductors' second end to contact a second electrical connector.

13. A connector as in claim 12 wherein the spring is comprised of a thin sheet of resilient material.

14. A connector as in claim 12 wherein the spring has at least two leg sections located between its first end and a second end of the spring.

15. A connector is in claim 14 wherein the spring has three leg sections.

16. A connector as in claim 14 wherein the spring has four leg sections.

17. A connector as in claim 13 wherein the connector further comprises a layer of electrically conductive material coating an interior side of the spring.

18. An electrical connector comprising:
- an array of springs, each of the springs having means for outwardly horizontally expanding in at least two directions upon being vertically compressed; and
- electrical conductors connected to the springs with first contact areas proximate a first end of the springs and second contact areas at sides of the springs wherein, upon vertically compressing the springs, the springs horizontally expand, outwardly deflecting the sides of the springs, to thereby move the second contact areas into contact with portions of a second connector located adjacent the springs.

* * * * *